(12) United States Patent
Gray

(10) Patent No.: US 9,230,698 B2
(45) Date of Patent: Jan. 5, 2016

(54) RADIATION STABLE SHIELD

(71) Applicant: Qioptiq Limited, Denbighshire (GB)

(72) Inventor: Andy Gray, Denbigshire (GB)

(73) Assignee: Qioptiq Limited, Denbighshire (GB)

( * ) Notice: Subject to any disclaimer, the term of this patent is extended or adjusted under 35 U.S.C. 154(b) by 354 days.

(21) Appl. No.: 13/935,999

(22) Filed: Jul. 5, 2013

(65) Prior Publication Data

US 2014/0007924 A1    Jan. 9, 2014

(30) Foreign Application Priority Data

Jul. 6, 2012    (GB) .................................... 1212141.4

(51) Int. Cl.
*G21F 1/00*    (2006.01)
*G21F 1/06*    (2006.01)
*H01L 31/041*    (2014.01)

(52) U.S. Cl.
CPC .. *G21F 1/06* (2013.01); *G21F 1/00* (2013.01); *H01L 31/041* (2014.12)

(58) Field of Classification Search
None
See application file for complete search history.

(56) References Cited

U.S. PATENT DOCUMENTS

| 4,243,460 A | 1/1981 | Nagler |
| 4,363,889 A | 12/1982 | Hoshino et al. |
| 4,564,491 A * | 1/1986 | Koestecki ..................... 264/108 |
| 2011/0232761 A1 * | 9/2011 | Lomasney ..................... 136/262 |

FOREIGN PATENT DOCUMENTS

GB    2457129    8/2009

OTHER PUBLICATIONS

David M. Wilt et al.; Pseudomorphic Glass to Enable High Efficiency Space Photovoltaic Devices; 37th IEEE Photovoltaic Specialists Conference; pp. 1949-1954; Seattle, WA.
UKIPO Search Report issued in respect of GB1212141.4 on Sep. 13, 2012.

* cited by examiner

*Primary Examiner* — Sheeba Ahmed
(74) *Attorney, Agent, or Firm* — Peter A. Nieves; Sheehan Phinney Bass + Green PA

(57) ABSTRACT

There is disclosed a radiation stable shield for use in space or high altitude applications. The shield comprises a plurality of overlapping planar glass flakes which are held in a lamellar matrix of flexible polymeric material. The flakes are each formed of a radiation stable glass which is suitable for use in space or high altitude applications. The flakes are arranged in alignment with the lamellar direction of the matrix.

32 Claims, 2 Drawing Sheets

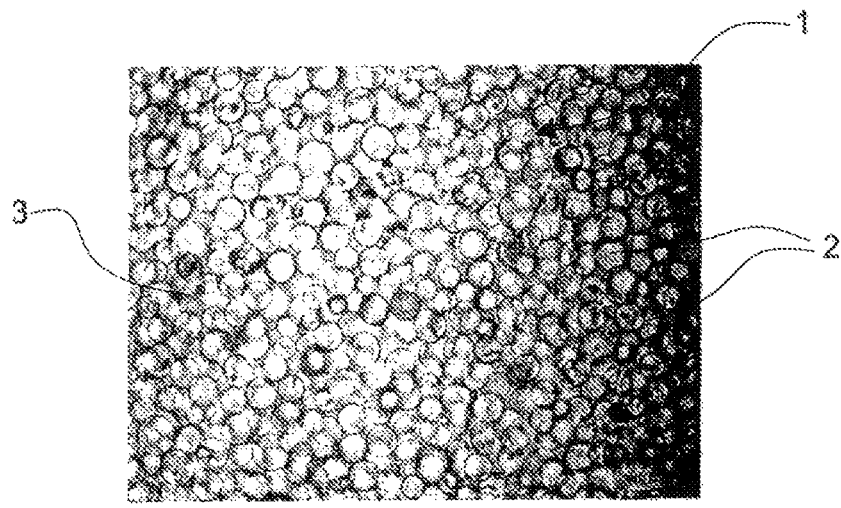
FIG_1
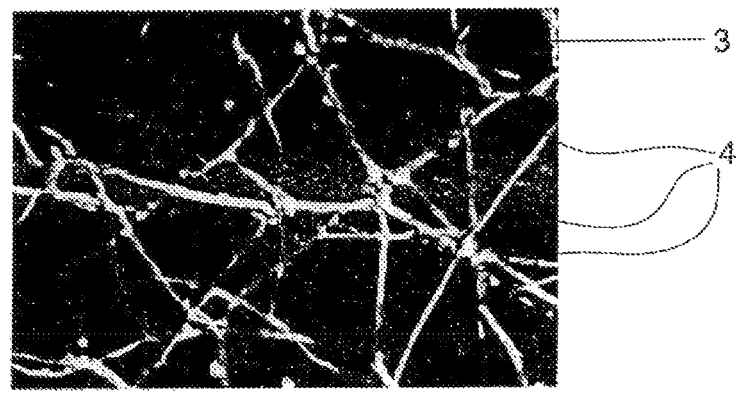
FIG_2
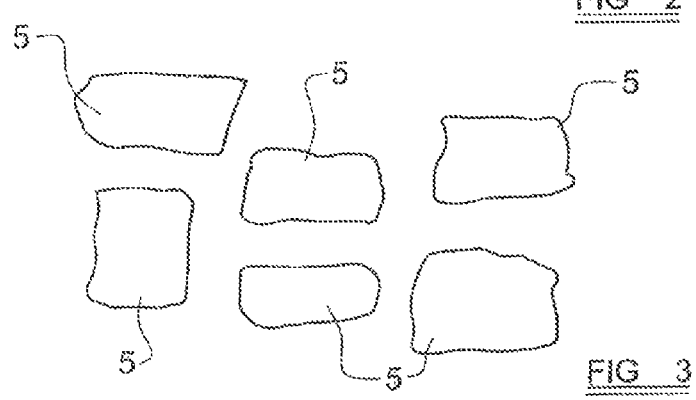
FIG_3

RADIATION STABLE SHIELD

CROSS-REFERENCE TO RELATED APPLICATIONS

This application claims priority to patent application number 1212141.4, filed in Great Britain on Jul. 6, 2012.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY REFERENCE OF MATERIAL SUBMITTED ON A COMPACT DISC OR AS A TExT FILE VIA THE OFFICE ELECTRONIC FILING SYSTEM

Not applicable.

STATEMENT REGARDING PRIOR DISCLOSURES BY THE INVENTOR OR A JOINT INVENTOR

Not applicable.

BACKGROUND OF THE INVENTION (1) Field of the Invention

The present invention relates to a radiation stable shield, and more particularly relates to a radiation stable shield for use in space applications.

(2) Description of Related Art Including Information Disclosed Under 37 CFR 1.97 and 1.98

U.S. Pat. No, 4,243,460 relates to a conductive laminate and a method of producing the same.

G. B. U.S. Pat. No. 2,457,129 relates to an electromagnetic shielding paint composition.

U.S. Pat. No. 4,363,889 relates to an anti-corrosive coating composition and a process for formation of anti-corrosive coatings.

An article entitled, *Pseudomorphic Glass to Enable High Efficiency Space Photovoltaic Devices*, by David M. Wilt, et al. and published at the 37$^{th}$ IEEE Photovoltaic Specialists Conference, at pp. 1949-1954 relates to pseudomorphic glass to enable high efficiency space photovoltaic devices.

BRIEF SUMMARY OF THE INVENTION

Photovoltaic cells for extra-terrestrial use on spacecraft solar arrays require some form of transparent shield to absorb low energy protons and other radiation present in the space environment and hence prevent, or at least reduce the intensity of, this radiation impinging on the cell and causing its performance to degrade. Conventionally, thin sheets of specially formulated glass or fused silica have been employed in this role. These materials are fragile, rigid, usually require individual attachment to the photovoltaic cell, and leave areas between adjacent cells open to the space environment, which limits the allowable bus voltage on the spacecraft (and hence power distribution efficiency and conductor weight) and leaves the solar array vulnerable to damage from electrical discharges.

It has therefore been proposed previously to provide transparent shields which are formed from a composite material containing glass or fused silica beads/granules within a moderately stable silicone adhesive, as shown in FIG. 1 of the attached drawings. Such shields are flexible and can be applied as a coating or as large sheets spanning the entire extent of a spacecraft's solar array. However, this type of composite material is not without problems itself, as the structure results in significant areas of exposed silicone between adjacent beads/granules. Tests have shown that the exposed silicon adhesive is readily degraded from exposure to low energy proton radiation, as exemplified by the magnified image of FIG. 2 which shows crazing of the silicone matrix due to proton damage.

It is a preferred object of the present invention to provide an improved radiation stable shield for use in space applications.

According to the present invention, there is provided a radiation stable shield for use in space or high altitude applications, the shield comprising a plurality of overlapping planar glass flakes held in a lamellar matrix of flexible polymeric material, said flakes each being formed of a radiation stable glass suitable for use in space applications and being arranged in alignment with the lamellar direction of the matrix.

Preferably, the shield is transparent.

Preferably, said flakes are at least 0.5 µm thick.

Advantageously, said flakes have a thickness of between 3 µm and 10 µm.

Conveniently, said flakes have lengths and/or widths of between 0.5 mm and 1 mm.

Advantageously, said radiation stable glass contains Cerium Oxide.

Conveniently, said radiation stable glass is a borosilicate glass.

Preferably, said radiation stable glass is CMX glass.

Alternatively, said radiation stable glass is CMG glass.

Said radiation stable glass may be CMO glass.

Preferably, said matrix comprises silicone resin.

Alternatively, said matrix comprises fluorinated ethylene propylene.

Conveniently, said matrix comprises polyimide.

Preferably, said flakes are provided in a laminated configuration throughout the matrix.

Advantageously, the shield is formed as a layer in which a number of said overlapping flakes each present an exposed surface substantially free of said polymeric material to thereby collectively define an outer surface of said layer.

The shield may be provided in the form of a sheet or film suitable for application to a spacecraft.

Alternatively, the shield may be provided in the form of a coating applied to a surface of a spacecraft.

Preferably, the shield is provided as a protective layer over an array of photovoltaic cells.

It has been found that a protective shield of the type defined above and in accordance with the present invention provides significantly less exposed matrix material and improved resistance to the space environment that the above-mentioned prior art proposals comprising composite material containing glass or fused silica beads/granules within a matrix of silicone adhesive. It has been found that the glass flakes, even if only as few microns in thickness, are capable of absorbing low energy protons, thereby preventing damage to the underlying material of the supporting matrix.

BRIEF DESCRIPTION OF THE SEVERAL VIEWS OF THE DRAWING(S)

So that the invention may be more readily understood, and so that further features thereof may be appreciated, embodiments of the invention will now be described by way of example with reference to the accompanying drawings in which:

FIG. 1 is a micrograph image of a prior art transparent shield for photovoltaic cells, formed from glass beads/granules held in a matrix of silicone adhesive;

FIG. 2 is a magnified image of the silicone matrix of the arrangement of FIG. 1, showing damage to the silicone resulting from exposure to protons in the space environment;

FIG. 3 is a schematic drawing showing a plurality of thin flakes of glass which are used in the shield of the present invention;

DETAILED DESCRIPTION OF THE INVENTION

Figure 4:
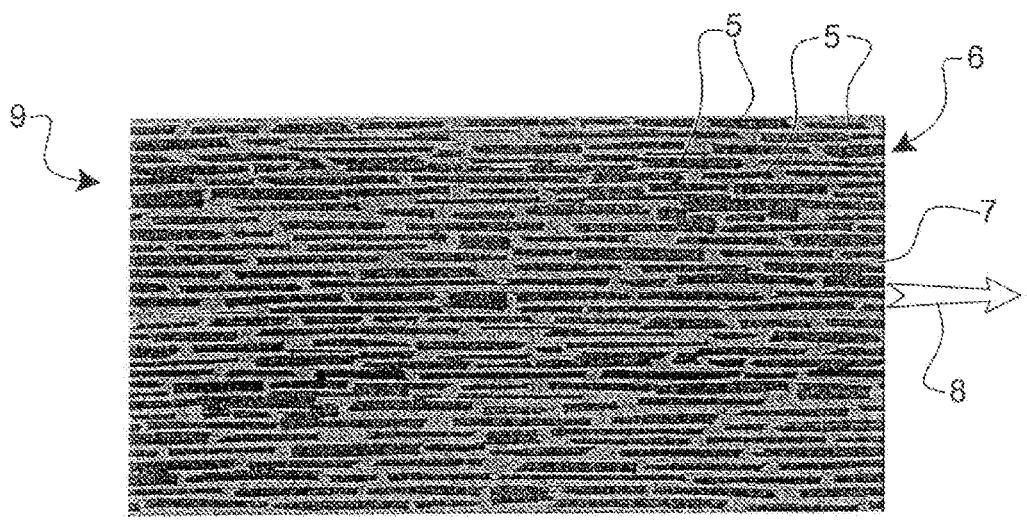
FIG. 4 is a cross-sectional representation of a shield in accordance with the present invention, comprising a plurality of the flakes of FIG. 3 supported in overlapping relation in a matrix.

Turning now to consider the drawings in more detail, as explained above FIG. 1 shows in magnified view a composite material 1 used in the manufacture of prior art transparent shields for solar arrays. The material 1 comprises a plurality of generally or near-spherical beads or granules 2 of glass or fused silica which are held in a matrix of silicone adhesive 3. Shields of this type are flexible due to the inherent flexibility of the silicone matrix, and so can be applied as large sheets over the entire extent of a solar array for use in space, or can be applied as a conformal coating prior to curing of the silicone adhesive 3. However, as will be appreciated, the generally or near-spherical shape of the beads or granules means that there are left areas of silicone between adjacent beads or granules. These areas of silicone will thus be exposed to low energy proton radiation in the space environment, with the result that the exposed areas of silicone will be readily degraded in the space environment. FIG. 2 shows the nature of this type of radiation degradation, and shows in particular extensive crazing 4 on an exposed area of the silicone matrix 3 (viewed at higher magnification in FIG. 2).

FIG. 3 shows, in plan view, a plurality of substantially planar flakes of glass 5 which, as will be explained in further detail below, are used in the present invention instead of the beads/granules 2 of the prior art arrangement. The flakes 5 are all formed of radiation stable glass of a type specifically formulated for use in space, and which is thus stable to electron, proton and ultra-violet radiation present in the space environment. For example, it is envisaged that such glass will be a Cerium-doped glass (preferably containing a percentage of Cerium in the form of Cerium Oxide). The glass may preferably be a borosilicate glass. Proposed types of glass suitable for use in the creation of flakes 5 for the present invention include "CMX", "CMG" and "CMO" glasses which are proprietary glass compositions of Qioptiq Space Technology It is known to use borosilicate glass which has been formulated to be resistant to darkening when exposed to ionising radiation by incorporation of cerium (typically up to 5% by weight) for the production of solar cell cover slips having a high transmission in the visible and infrared regions of the spectrum. It is envisaged that any such glass formed into thin flakes may be used in this invention. For example:

CMG is a proprietary borosilicate glass composition of Qioptiq Space Technology characterised in that the glass composition comprises the following components:—the total amount of $SiO_2+Al_2O_3+B_2O_3$ being from 81 to 91 mol %, the total amount of $Li_2O+Na_2O+K_2O$ being from 7.6 to 10.6 mol %, and one or more of MgO, CaO, SrO, BaO, ZnO and PbO, in a total amount of from 0 to 7 mol %; and in that the glass composition exhibits a coefficient of linear expansion within the range $64.0\text{-}70.0\times10^{-7}/\text{deg. C.}$ which makes it especially compatible with gallium arsenide/germanium photovoltaic cells having a similar coefficient of expansion.

CMX is also is a proprietary borosilicate glass composition of Qioptiq Space Technology broadly similar to CMG but formulated to offer increased absorption in the UV spectrum for the protection of the adhesive in the conventional cell/coverglass assembly.

CMO is a third proprietary borosilicate glass composition of Qioptiq Space Technology produced by including at least 5% by weight of barium oxide in a borosilicate glass composition. Because barium has a low absorption in the ultra violet spectrum, its use enables radiation stable glasses of low ultra violet absorption to be produced, alleviating problems of overheating when the glasses are used for cladding space craft.

Other manufacturers offer glass for similar applications, for example glass codes 0213 and 0214 formerly manufactured by Corning Inc. and processed for space use by JDS Uniphase Corporation. 0213 is a borosilicate glass composition with a nominal 5% cerium dioxide added to impart radiation stability and UV absorption. 0214 is formulated to be stable against radiation at a lower level of cerium dioxide, and offers better transmission at short wavelengths than the 0213.

The glass flakes 5 are preferably all configured so as to have generally similar thicknesses, although it is not essential for all of the flakes to have exactly the same thickness as one another. It has been found that a flake thickness of 0.5 µm or more provides effective blockage of low energy proton radiation experienced in the space environment. However, it is presently preferred to use glass flakes having thicknesses in the range of 3 µm to 10 µm, as these are relatively easily produced on a commercial scale whilst providing very good radiation resistance.

It is preferred that all of the flakes 5 will have generally similar dimensions in terms of their width and length as viewed in FIG. 3. However, again it is to be noted that strictly identical dimensions are not considered essential to the present invention. Presently preferred flakes 5 have a length and width falling in the range of 0.5 mm to 1 mm. As will be noted, the flakes therefore preferably have a relatively low aspect ratio in terms of length to width.

The glass flakes 5 are incorporated in a matrix of flexible polymeric material having good optical and adhesive properties. Preferred embodiments of the present invention employ a matrix of flexible silicone resin because this has been found to have appropriate optical and adhesive qualities for use in transparent cover shields. However, it is to be appreciated that alternative polymeric materials could be used for the matrix instead of silicone such as, for example, fluorinated ethylene propylene resin or polyimide.

Figure 5:
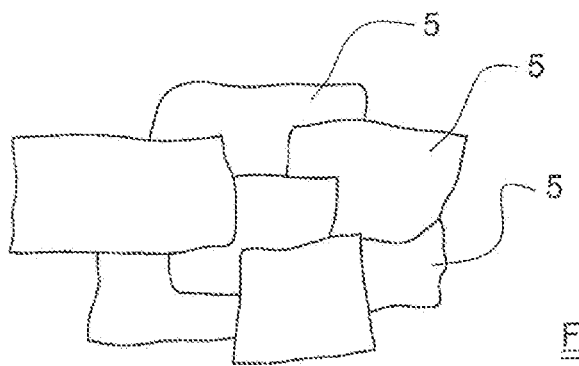
FIG. 5 is a schematic illustration showing the manner in which the flakes overlap with one another.

FIG. 4 shows a cross-sectional view of a shield 6 in accordance with the present invention, comprises a plurality of the glass flakes 5 arranged in a thin lamellar matrix 7 of silicone resin. As can be seen from FIG. 4, but also in FIG. 5 (which shows the arrangement of a selection of the flakes as viewed from above), the flakes 5 are arranged in overlapping relationship to one another throughout the matrix, and thus tend to lie in strata of overlapping flakes throughout the thickness of the matrix. The flakes 5 are all arranged generally parallel with one another so as to be aligned with the lamellar direction 8 of the matrix. The overlapping relationship of adjacent flakes is important to the effectiveness of the shield of the present invention in providing improved mechanical durability, and most importantly improved radiation and UV shielding in comparison to prior art flexible shields. By using flakes 5 of a shape having a low aspect ratio, the overlapping effect of the flakes throughout the supporting matrix 7 is improved compared to using long and narrow flakes with a higher aspect ratio.

The overlapping relationship between adjacent flakes 5 is significant because it serves to prevent the exposure of significant areas of the supporting matrix 7 between the flakes, which as explained above is a problem with prior art shields because neighbouring beads or granules abut in a manner which leaves gaps between them. The overlapping nature of the flakes 5 in the shield of the present invention thus protects the supporting matrix 7 from radiation exposure. As will be appreciated, by using flexible material for the matrix 7, and very thin glass flakes, the shield 6 as a whole is flexible. As the shield 6 bends or flexes, adjacent overlapping flakes 5 are able to slide over one another without damage and without exposing matrix material there-between. In the event that the shield 6 is applied over a curved surface, either as a conformal coating or as a pre-formed thin film or sheet, then the flakes 5 will remain overlapped and will each align to the local lamellar direction of the coating.

Provided the matrix 7 is maintained as a fluid in its un-cured state, the flakes 5 may be incorporated as an admixture into the un-cured matrix 7 prior to applying a coating of the mixture to the component to be protected. Surface tension and other effects mean that the flakes 5 have a naturally tendency to align themselves within the coating film, and to form a stratified, overlapping structure. The volume fraction of flake 5 and matrix 7 in the mixture, and the application and curing regimes may be determined experimentally to optimise this tendency for the formation of appropriate shields for particular circumstances.

Alternatively, it is proposed that alternating layers of matrix material 7 and flakes 5 will be built up one by one prior to the matrix material being cured. For example, it is envisaged that this kind of laminating method could be used to lay up thin pre-formed sheets of the matrix material which can then be partially cured to substantially fix the flakes 5 in position within the matrix 7. The sheets could then be transferred to a manufacturing facility where a spacecraft solar array or the like is being manufactured, where the sheets could then be carefully applied over the solar array without losing the orientation of the flakes, where-after the matrix material can be substantially fully cured so that it becomes adhered over the solar array to form the finished shield. Alternatively, the sheild 6 could be built up from alternating layers of matrix material and flakes in situ on the spacecraft.

In another alternative, the flakes 5 may be dispersed in the matrix 7 prior to it being formed into sheets by extrusion or drawing. The shearing flows inherent in these forming processes cause the flakes to become aligned with the plane of the sheet.

In preferred embodiments of the present invention, the shield 6 is formed such that the flakes 5 at its uppermost surface 9 (as shown in FIG. 4) each present an exposed surface which is substantially free of the matrix material 7. This can be achieved by removing any exposed matrix material 7 from the outer surface of the shield 6 to expose the planar surfaces of the flakes 5. By removing or otherwise eliminating matrix material from the outer surface 9 of the shield 6, the emissivity of the shield will be improved (because the glass flakes 5 have a higher emissivity than the polymeric matrix material 7), which results in the shield 6 providing improved thermal control the underlying solar array to which it may be applied. Also, the elimination of any exposed matrix material 7 on the surface 9 of the shield reduces even further the likelihood of the matrix material 7 being degraded, thereby substantially eliminating the creation of possible detritus from such degradation of the polymeric material on exposure to radiation. Also, the glass flakes are largely impervious to atomic oxygen attack, and so by eliminating matrix material on the exposed surface 10, the proposed shield has a greatly improved resistance to atomic oxygen attack compared with the polymeric matrix 7 alone.

It has been found that transparent shields in accordance with the present invention provide a significant reduction in scattered light compared to prior art shields which use approximately spherical or granular glass particles. This is due to the planar nature of the glass flakes in the present invention.

It may be possible to improve the performance of the shield 6 even further by applying thin film coatings over it, such as anti-reflection, UV reflecting, or high emissivity films.

The above-described protective shields of the present invention are particularly suitable for application to the front or rear surfaces of flexible solar cells such as, for example, CdTe or amorphous silicon or inverted metamorphic cells of a type commonly used in space.

It is also to be noted that the shields of the present invention, although particularly suitable for use in protecting flexible solar cells or arrays on account of their inherent flexibility, are also suitable for use in protecting rigid or substantially rigid solar cells or arrays.

The shields of the present invention can be provided in the form of transparent conformal coatings to fully or partially encapsulate solar arrays on spacecraft.

The shields of the present invention are also suitable for use as structural "superstrates" for photovoltaic arrays.

Whilst the invention has been described above with specific reference to use of the shield 6 in transparent form to protect solar arrays, it is to be appreciated that the shields in accordance with the present invention could find other useful applications in the space or high altitude environment. For example, the shield of the present invention could be used as a thermal control coating, or alternatively as an electrically insulating coating.

When used in this specification and claims, the terms "comprises" and "comprising" and variations thereof mean that the specified features, steps or integers are included. The terms are not to be interpreted to exclude the presence of other features, steps or integers.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A radiation stable shield for use in space or high altitude applications, the shield comprising
a plurality of overlapping planar glass flakes held in a lamellar matrix of flexible polymeric material,
said flakes each being formed of a radiation stable glass suitable for use in space or high altitude applications and being arranged in alignment with the lamellar direction of the matrix,
wherein said radiation stable glass is a cerium-doped glass.

2. A shield according to claim 1, wherein said flakes are at least 0.5 µm thick.

3. A shield according to claim 1, wherein said flakes have a thickness of between 3 µm and 10 µm.

4. A shield according to claim 1, wherein said flakes have lengths and/or widths of between 0.5 mm and 1 mm.

5. A shield according to claim 1, wherein said radiation stable glass contains Cerium Oxide.

6. A shield according to claim 1, wherein said radiation stable glass is a borosilicate glass.

7. A shield according to claim 1, wherein said radiation stable glass is a borosilicate glass composition with a total amount of $SiO_2+Al_2O_3+B_2O_3$ being from 81 to 91 mol %, a total amount of $Li_2O+Na_2O+K_2O$ being, from 7.6 to 10.6 mol %, and one or more of MgO, CaO, SrO, BaO, ZnO, and PbO, being in a total amount of from 0 to 7 mol %, and wherein the borosilicate glass composition exhibits a coefficient of linear expansion within the range $64.0$-$70.0 \times 10^{-7}$/deg. C.

8. A shield according to claim 1, wherein said radiation stable glass includes at least 5% by weight of barium oxide in a borosilicate glass composition.

9. A shield according to claim 1, wherein said matrix comprises silicone resin.

10. A shield according to claim 1, wherein said matrix comprises fluorinated ethylene propylene.

11. A shield according to claim 1, wherein said matrix comprises polyimide.

12. A shield according to claim 1, wherein said flakes are provided in a laminated configuration throughout the matrix.

13. A shield according to claim 1, formed as a layer in Which a number of said overlapping flakes each present an exposed surface substantially free of said polymeric material to thereby collectively define an outer surface of said layer.

14. A shield according to claim 1, provided in the form of a sheet or film suitable for application to a spacecraft.

15. A shield according to claim 1 provided in the form of a coating applied to a surface of a spacecraft.

16. A shield according to claim 1, provided as a protective layer over an array of photovoltaic cells.

17. An assembly comprising:
one or more solar cells; and
a radiation stable shield coupled to the one or more solar cells, the radiation stable shield comprising:
a plurality of overlapping planar glass flakes held in a lamellar matrix of flexible polymeric material,
said flakes each being formed of a radiation stable glass suitable for use in space or high altitude applications and being arranged in alignment with the lamellar direction of the matrix,
wherein said radiation stable glass is a cerium-doped glass.

18. A radiation stable shield for use in space or high altitude applications, the shield comprising
a plurality of overlapping planar glass flakes held in a lamellar matrix of flexible polymeric material,
said flakes each being formed of a radiation stable glass suitable for use in space or high altitude applications and being arranged in alignment with the lamellar direction of the matrix,
wherein said matrix comprises silicone resin, fluorinated ethylene propylene, or polyimide.

19. A shield according to claim 18, wherein said flakes are at least 0.5 µm thick.

20. A shield according to claim 18, wherein said flakes have a thickness of between 3 µm and 10 µm.

21. A shield according to claim 18, wherein said flakes have lengths and/or widths of between 0.5 mm and 1 mm.

22. A shield according to claim 18, wherein said radiation stable glass is a cerium-doped glass.

23. A shield according to claim 18, wherein said radiation stable glass contains Cerium Oxide.

24. A shield according to claim 18, wherein said radiation stable glass is a borosilicate glass.

25. A shield according to claim 18, wherein said radiation stable glass is a borosilicate glass composition with a total amount of $SiO_2+Al_2O_3+B_2O_3$ being from 81 to 91 mol %, a total amount of $Li_2O+Na_2O+K_2O$ being from 7.6 to 10.6 mol %, and one or more of MgO, CaO, SrO, BaO, ZnO and PbO, being in a total amount of from 0 to 7 mol %, and wherein the borosilicate glass composition exhibits a coefficient of linear expansion within the range $64.0$-$70.0 \times 10^{-7}$/deg. C.

26. A shield according to claim 18, wherein said radiation stable glass includes at least 5% by weight of barium oxide in a borosilicate glass composition.

27. A shield according to claim 18, wherein said flakes are provided in a laminated configuration throughout the matrix.

28. A shield according to claim 18, formed as a layer in which a number of said overlapping flakes each present an exposed surface substantially free of said polymeric material to thereby collectively define an outer surface of said layer.

29. A shield according to claim 18, provided in the form of a sheet or film suitable for application to a spacecraft.

30. A shield according to claim 18 provided in the form of a coating applied to a surface of a spacecraft.

31. A shield according to claim 18, provided as a protective layer over an array of photovoltaic cells.

32. An assembly comprising:
one or more solar cells; and
a radiation stable shield coupled to the one or more solar cells, the radiation stable shield comprising:
a plurality of overlapping planar glass flakes held in a lamellar matrix of flexible polymeric material,
said flakes each being formed of a radiation stable glass suitable for use in space or high altitude applications and being arranged in alignment with the lamellar direction of the matrix,
wherein said matrix comprises silicone resin, fluorinated ethylene propylene, or polyimide.

* * * * *